United States Patent
Ahn et al.

(10) Patent No.: US 7,410,853 B2
(45) Date of Patent: Aug. 12, 2008

(54) METHOD OF FORMING A NANOWIRE AND METHOD OF MANUFACTURING A SEMICONDUCTOR DEVICE USING THE SAME

(75) Inventors: Young-Joon Ahn, Daejeon (KR); Choong-Ho Lee, Seongnam-si (KR); Chul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 274 days.

(21) Appl. No.: 11/431,216

(22) Filed: May 10, 2006

(65) Prior Publication Data

US 2007/0042582 A1    Feb. 22, 2007

(30) Foreign Application Priority Data

May 11, 2005    (KR)    .................. 10-2005-0039444

(51) Int. Cl.
  *H01L 21/336*    (2006.01)
(52) U.S. Cl. .................. 438/197; 438/303; 977/938
(58) Field of Classification Search .................. 438/197, 438/303, 306; 977/762, 938
See application file for complete search history.

(56) References Cited

U.S. PATENT DOCUMENTS 5,493,136 A    2/1996    Matsuzaki et al.    ........... 257/287

2005/0136585 A1*    6/2005    Chau et al.    ................... 438/214
2007/0148857 A1*    6/2007    Ban et al.    ................... 438/243
2007/0262344 A1*    11/2007    Anwar et al.    ................. 257/157

FOREIGN PATENT DOCUMENTS

| JP | 06-140636 | 5/1994 |
| JP | 2002-110832 | 4/2002 |
| KR | 10-2004-0091309 | 10/2004 |

* cited by examiner

*Primary Examiner*—Tuan H Nguyen
(74) *Attorney, Agent, or Firm*—Mills & Onello, LLP (57) ABSTRACT

In a method of forming a nanowire in a semiconductor device, a trench is formed by partially etching a bulk semiconductor substrate. An insulation layer pattern is formed on the substrate to fill up the trench. The insulation layer pattern covers a first region of the substrate where the nanowire is formed, and additionally covers a second region of the substrate connected to the first region. An opening is formed by etching an exposed portion of the substrate by the insulation layer pattern. A spacer is formed on sidewalls of the opening and the insulation layer pattern. The nanowire connected to the second region is formed by anisotropically etching a portion of the substrate exposed by the opening until a portion of the insulation layer pattern formed in the trench is exposed.

24 Claims, 8 Drawing Sheets

METHOD OF FORMING A NANOWIRE AND METHOD OF MANUFACTURING A SEMICONDUCTOR DEVICE USING THE SAME

CROSS REFERENCE TO RELATED APPLICATION

This application claims priority under 35 USC § 119 to Korean Patent Application No. 2005-39444 filed on May 11, 2005, the contents of which are incorporated herein by reference in their entirety.

BACKGROUND OF THE INVENTION

1. Field of the Invention

Example embodiments of the present invention relate to a method of forming a nanowire and a method of manufacturing a semiconductor device using the same. More particularly, example embodiments of the present invention relate to a method of forming a nanowire including a semiconductor material by using a bulk semiconductor substrate, and a method of manufacturing a semiconductor device using the same.

2. Description of the Related Art

As information process apparatuses, such as computers, have been widely used, semiconductor devices employed in the information process apparatuses have also been rapidly developed to have high response speeds and large storage capacities. Thus, semiconductor manufacturing technology has been developed to improve the integration degree, the reliability and the response speed of the semiconductor device.

Since a metal oxide semiconductor (MOS) transistor is a main component in a current semiconductor memory device, the MOS transistor is required to have low power consumption, a high integration degree, a rapid response speed, etc. To improve characteristics of a conventional MOS transistor, a channel length of the MOS transistor is reduced and depths of source/drain regions in the MOS transistor are decreased. In addition, a gate insulation layer of the MOS transistor has a reduced effective thickness.

However, the MOS transistor may have degraded electrical characteristics because of a short channel effect caused by the decrease of the channel length. Additionally, the MOS transistor may have an increased contact resistance when the source/drain regions have the reduced depths. Furthermore, the gate insulation layer may not have a desired thickness because of the current semiconductor manufacturing technology. Hence, the conventional MOS transistor may not meet desired high-speed operation characteristics.

A planar type transistor has a channel region adjacent to a surface portion of a semiconductor substrate. Thus, surface scattering of electrons may be caused when the electrons are moved through the channel region of the planar type transistor. As a result, mobility of the electrons may be considerably reduced so that the planar type transistor may not have the required high response speed.

Recently, a semiconductor nanowire has been employed as a channel of a transistor so as to obtain the transistor having a low power consumption, a high integration degree, a rapid response speed, etc. The semiconductor nanowire indicates a wire having a width of several nanometers to scores of nanometers.

However, the nano-technology for manufacturing the transistor has not yet been sufficiently developed because a nano-sized semiconductor material shows electrical, chemical and optical characteristics quite different from those of a bulk semiconductor material due to the high ratio of the surface area relative to the volume in the nano-sized semiconductor material and the quantum bonding effect of the nano-sized semiconductor material.

A carbon nanotube (CNT) has been mainly researched as a nano-sized semiconductor material in a semiconductor device. For example, the CNT is used as a channel of a field effect transistor (FET). However, the CNT may have poor characteristics for a channel in a semiconductor device such as a transistor, because the electrical conductivity and band gap of the CNT may not be properly adjusted.

Recently, besides the CNT, various nano-sized semiconductor materials have been researched to form a semiconductor nanowire in a semiconductor device such as a transistor. For example, a semiconductor nanowire of silicon has an excellent crystalline structure so that the semiconductor nanowire of silicon may be directly employed as a channel of the transistor. Further, the electrical conductivity and band gap of the semiconductor nanowire may be adjusted by doping impurities therein.

Particularly, a volume inversion may be generated in a semiconductor nanowire when the semiconductor nanowire is employed in a channel of a transistor, and a gate of the transistor completely encloses the semiconductor nanowire. Thus, electrons may move through the semiconductor nanowire without surface scattering thereof, and the mobility of the electrons may increase, thereby improving the response speed of the transistor. Further, the short channel effect may not occur in the transistor including the semiconductor nanowire.

A conventional semiconductor nanowire is usually formed by growing a semiconductor material through a selective epitaxial growth (SEG) process. When the conventional semiconductor nanowire is formed by the SEG process, however, manufacturing processes are complicated and manufacturing costs may increase. Further, the electrical characteristics of the conventional nanowires may not be constantly maintained through the SEG process.

Therefore, a more simple method is still required to form a semiconductor nanowire with low cost.

SUMMARY OF THE INVENTION

Example embodiments of the present invention provide a method of forming a nanowire with low cost through a simplified process.

Example embodiments of the present invention provide a method of manufacturing a semiconductor device including the nanowire.

According to one aspect of the present invention, there is provided a method of forming a nanowire. In the method of forming the nanowire, a trench is formed by partially etching a semiconductor substrate. An insulation layer pattern is formed on the semiconductor substrate to fill up the trench. The insulation layer pattern covers a first region of the semiconductor substrate where the nanowire is formed. The insulation layer pattern additionally covers a second region of the semiconductor substrate connected to the first region. An opening is formed by etching an exposed portion of the semiconductor substrate through the insulation layer pattern using the insulation layer pattern as an etching mask. A spacer is formed on sidewalls of the opening and the insulation layer pattern. The nanowire connected to the second region is formed by anisotropically etching a portion of the semiconductor substrate exposed by the opening until a portion of the insulation layer pattern formed in the trench is exposed.

In an example embodiment of the present invention, the first region may have a width capable of generating a volume inversion to form a channel. For example, the first region has a width below about 5 nm.

In an example embodiment of the present invention, the trench may be formed by forming a first hard mask pattern on the semiconductor substrate, and by partially etching the semiconductor substrate using the first hard mask pattern as an etching mask. In the formation of the insulation layer pattern, a second hard mask pattern exposing a portion of the first region adjacent to the trench may be formed by partially etching the first hard mask pattern. A first preliminary insulation layer pattern may be formed on the exposed portion of the first region to fill up the trench. An opening exposing the second region and a third hard mask pattern covering the first region except for the exposed portion of the first region may be formed by partially etching the second hard mask pattern and the first preliminary insulation layer pattern. A second preliminary insulation layer pattern may be formed to fill up the opening. Then, the third hard mask pattern may be removed. The second hard mask pattern may be formed by an anisotropic etching process. An etched amount of the first hard mask pattern may be substantially the same as a width of a channel that generates a volume inversion. In the formation of the second preliminary insulation layer pattern, a second preliminary insulation layer may be formed to completely fill up the opening. The second preliminary insulation layer may be partially removed until the third hard mask pattern is exposed.

In an example embodiment of the present invention, the opening may have a depth substantially the same as a width of a channel that generates a volume inversion.

In an example embodiment of the present invention, the spacer may be formed using a material having an etching selectivity relative to the semiconductor substrate. For example, the spacer is formed using silicon oxide.

In an example embodiment of the present invention, the nanowire may be formed by a wet etching process or a chemical dry etching process.

In an example embodiment of the present invention, the insulation layer pattern may be partially etched and the spacer may be completely etched to expose the nanowire.

According to another aspect of the present invention, there is provided a method of manufacturing a semiconductor device. In the method of manufacturing the semiconductor device, a trench is formed by partially etching a semiconductor substrate. A first insulation layer pattern is formed on the semiconductor substrate to fill up the trench. The first insulation layer pattern covers a source/drain formation region of the semiconductor substrate, and the first insulation layer pattern additionally covers a nanowire formation region of the semiconductor substrate connected to the source/drain formation region. An opening is formed by etching an exposed portion of the semiconductor substrate through the first insulation layer pattern using the first insulation layer pattern as an etching mask. A spacer is formed on sidewalls of the opening and the first insulation layer pattern. The nanowire connected to the source/drain formation region is formed by anisotropically etching a portion of the semiconductor substrate exposed by the opening until a portion of the first insulation layer pattern formed in the trench is exposed. A second insulation layer pattern is formed by partially etching the first insulation layer pattern and fully etching the spacer until the nanowire is exposed. A gate insulation layer is formed on the semiconductor substrate to cover the nanowire. A gate electrode is formed on the gate insulation layer to enclose the nanowire.

In an example embodiment of the present invention, the nanowire formation region may have a width that generates a volume inversion in a channel.

In an example embodiment of the present invention, an impurity region having a high impurity concentration may further formed at a portion of the semiconductor substrate exposed by the opening the after forming the spacer. The impurity region may be separated from a bottom face of the opening by a distance substantially the same as a width of the nanowire. The impurity region may have a conductivity type opposite to a conductivity type of the semiconductor device.

In an example embodiment of the present invention, the trench may be formed by forming a first hard mask pattern on the semiconductor substrate, and by partially etching the semiconductor substrate using the first hard mask pattern as an etching mask. In the formation of the first insulation layer pattern, a second hard mask pattern exposing a portion of the nanowire formation region adjacent to the trench may be formed by partially etching the first hard mask pattern. A first preliminary insulation layer pattern may be formed on the exposed portion of the nanowire formation region to fill up the trench. An opening exposing the source/drain formation region and a third hard mask pattern covering the nanowire formation region except for the exposed portion of the nanowire formation region may be formed by partially etching the second hard mask pattern and the first preliminary insulation layer pattern. A second preliminary insulation layer pattern may be formed to fill up the opening. Then, the third hard mask pattern may be removed. An etched amount of the first hard mask pattern may be substantially the same as a width of a channel that generates a volume inversion.

In an example embodiment of the present invention, the opening may have a depth substantially the same as a width of a channel that generates a volume inversion.

In an example embodiment of the present invention, source/drain regions may further be formed by implanting impurities into the source/drain formation region.

In an example embodiment of the present invention, partially etching the first insulation layer pattern and fully etching the spacer may be carried out by wet a etching process.

According to the present invention, a bulk semiconductor substrate may be partially etched to form a semiconductor nanowire having a scale that may generate a volume inversion of a semiconductor material. Thus, the semiconductor nanowire may be formed with low cost through a simplified process. When the semiconductor nanowire is employed in a transistor, the transistor may have a high response speed because electrons may move through the semiconductor nanowire by greatly improved electron mobility.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF THE EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 7:
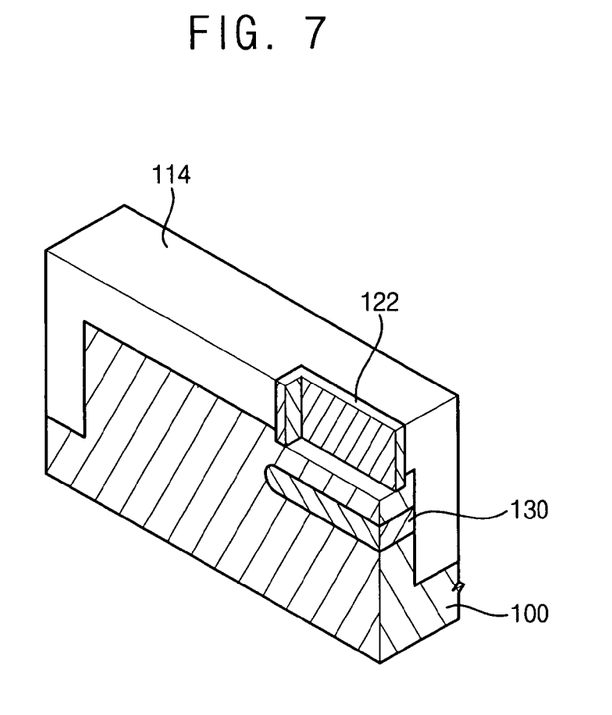
Figure 8:
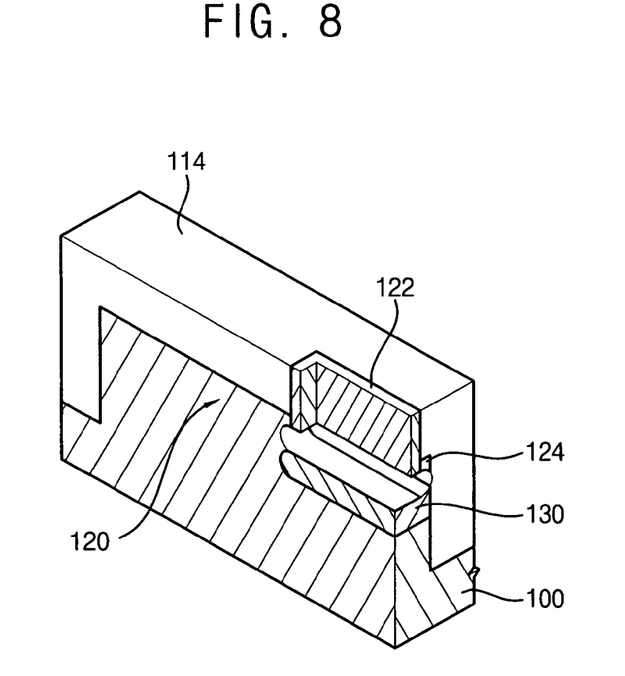
Figure 9:
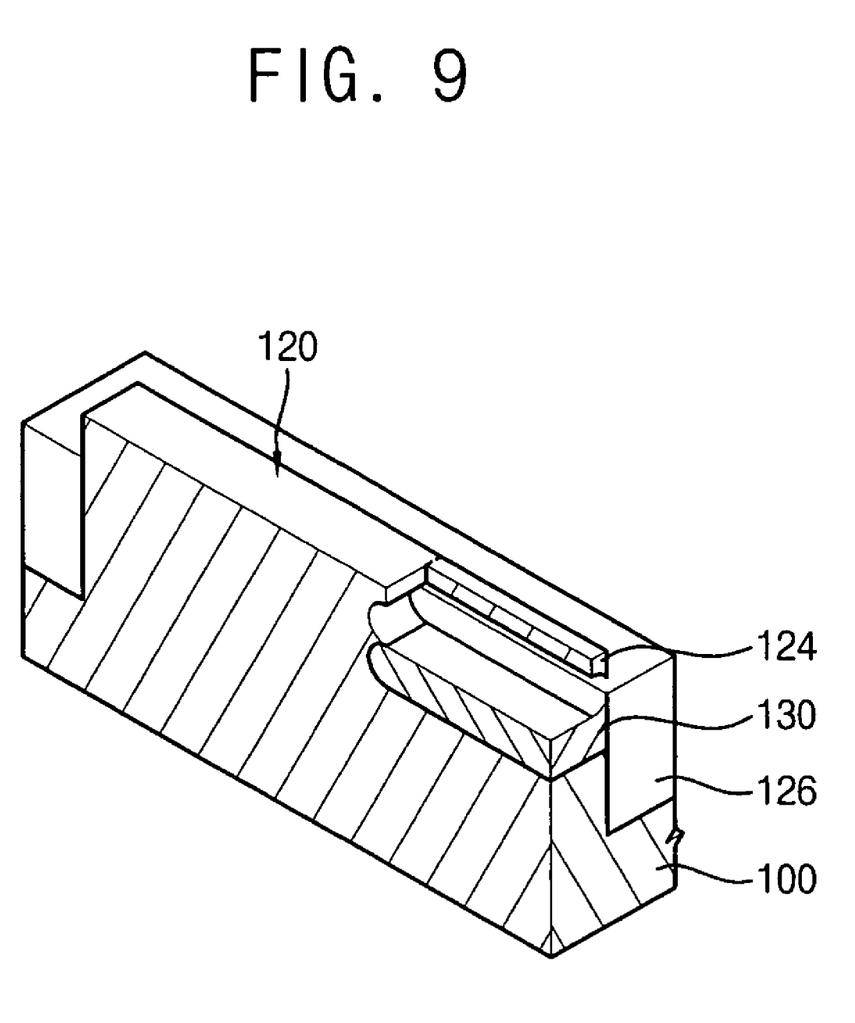
Figure 10:
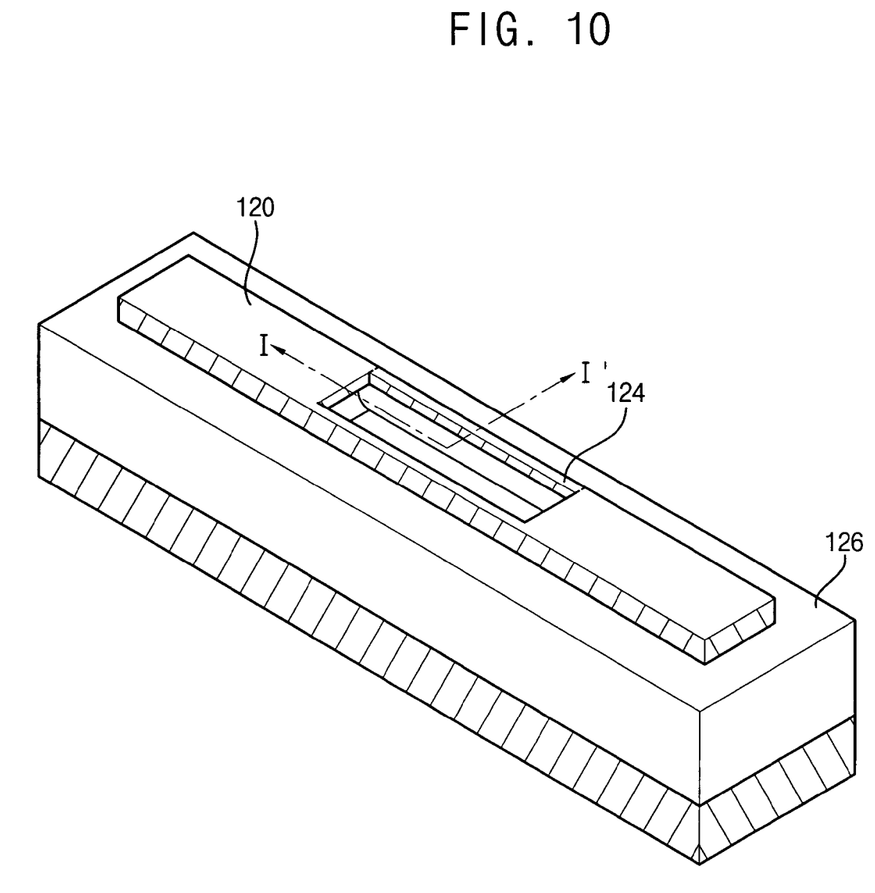
FIG. 10 is a perspective view illustrating the nanowire for a channel in FIG. 9.

FIGS. 1 to 9, 11 and 12 are partially cut perspective views illustrating a method of manufacturing a semiconductor device including a nanowire in accordance with an example embodiment of the present invention. FIG. 10 is a perspective view illustrating the nanowire for a channel in FIG. 9. FIG. 9 is a cross-sectional view illustrating the semiconductor device taken along a line of I-I' in FIG. 10. FIG. 13 is a perspective view illustrating a semiconductor device including a nanowire in accordance with an example embodiment of the present invention. FIGS. 1 to 9, 11 and 12 shows the semiconductor device taken along a line of II-II' in FIG. 13.

Figure 1:
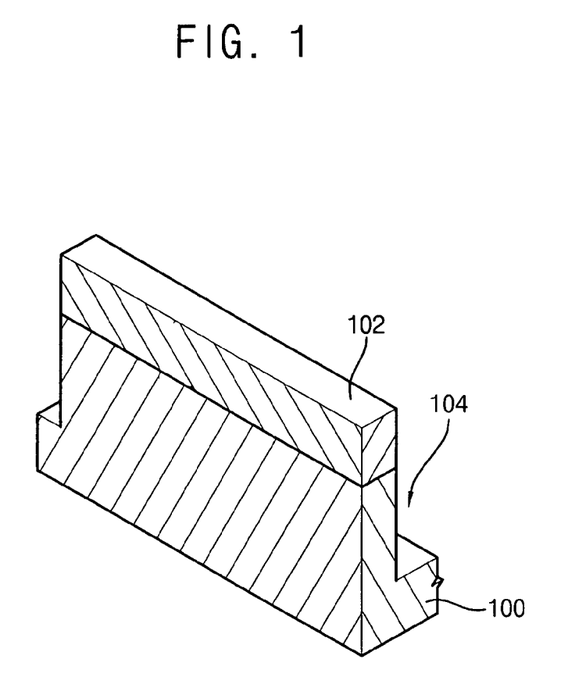
FIGS. 1 to 9, 11 and 12 are partially cut perspective views illustrating a method of manufacturing a semiconductor device including a nanowire in accordance with an example embodiment of the present invention.

Referring to FIG. 1, a bulk semiconductor substrate 100 is prepared. The bulk semiconductor substrate 100 may include a semiconductor material such as silicon. For example, the bulk semiconductor substrate 100 includes a single crystalline silicon substrate. The single crystalline silicon substrate may be formed by a Czochralski method.

A hard mask layer (not shown) is formed on the bulk semiconductor substrate 100. The hard mask layer is patterned to form a first hard mask pattern 102 that serves as an etching mask used in an etching process for forming a trench 104 at an upper portion of the bulk semiconductor substrate 100. The hard mask layer may be formed using a material that has an etching selectivity relative to the bulk semiconductor substrate 100. Particularly, the hard mask layer may include a material that may not be etched while partially etching the bulk semiconductor substrate 100. For example, the hard mask layer is formed using a nitride such as silicon nitride.

In an example embodiment of the present invention, an anti-reflective layer may be formed on the hard mask layer so as to ensure a process margin of a subsequent photolithography process. The anti-reflective layer may be formed using an oxynitride such as silicon oxynitride.

After a first photoresist film is formed on the hard mask layer, the first photoresist film is exposed and developed to thereby form a first photoresist pattern (not shown) on the hard mask layer. The first photoresist pattern may selectively cover an active area of the bulk semiconductor substrate 100. The semiconductor device such as a transistor will be formed in the active area.

The hard mask layer is etched using the first photoresist pattern as an etching mask so that the first hard mask pattern 102 is formed on the bulk semiconductor substrate 100.

The first photoresist pattern may be removed from the hard mask pattern 102 by an ashing process and/or a stripping process.

Using the hard mask pattern 102 as the etching mask, the bulk semiconductor substrate 100 is partially etched to form the trench 104 at the upper portion of the bulk semiconductor substrate 100. When the trench 104 is formed, the active area of the bulk semiconductor substrate 100 is defined.

Figure 2:
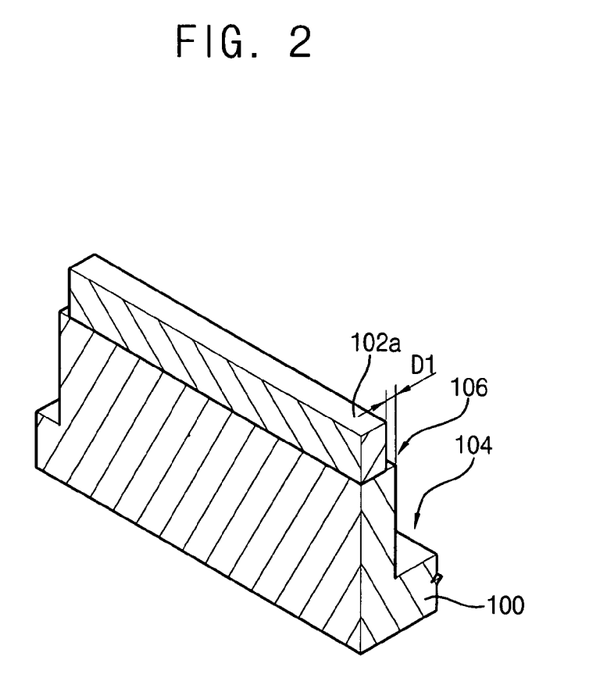

Referring to FIG. 2, a lateral portion of the hard mask pattern 102 is partially etched to form a second hard mask pattern 102a that exposes a first region of the active area adjacent to the trench 104. The second hard mask pattern 102a may be formed by an anisotropic etching process.

The exposed first region of the active area corresponds to a nanowire formation region 106 where a nanowire 124 (see FIG. 8) for a channel is positioned.

To form the nanowire from the exposed first region of the active area, the exposed first region of the active area has a first width D1 capable of generating a volume inversion of a semiconductor material in the active area. The first width D1 denotes a distance between an end of the active area and an end of the second hard mask pattern 102a. For example, the first width D1 is in a range of below about 5 nm so as to efficiently generate the volume inversion for forming a channel of the semiconductor device such as the transistor. Thus, an etched amount of the lateral portion of the first hard mask pattern 102 may be substantially the same as a width of the first region of the active area in order to generate the volume inversion.

Figure 3:
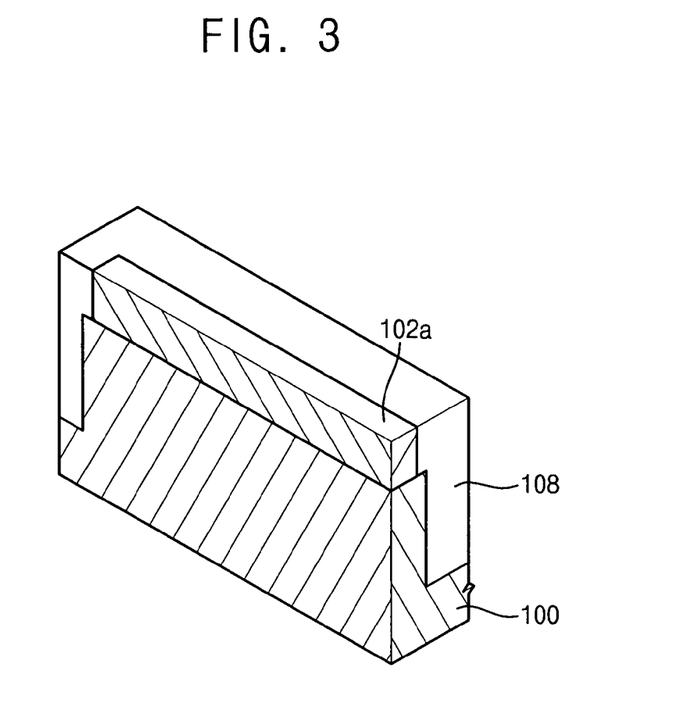

Referring to FIG. 3, a first preliminary insulation layer (not shown) is formed on the bulk semiconductor substrate 100 to sufficiently fill up the trench 104 and to sufficiently cover the second hard mask pattern 102a and the exposed first region of the active area. The first preliminary insulation layer may be formed using an oxide. For example, the first preliminary insulation layer is formed using high-density plasma chemical vapor deposition (HDP-CVD) oxide or boro-phosphor silicate glass (BPSG).

The first preliminary insulation layer is partially removed until the second hard mask pattern 102a is exposed to thereby form a first preliminary insulation layer pattern 108 covering the exposed first region and the trench 104. The first preliminary insulation layer pattern 108 may be formed by a chemical mechanical polishing (CMP) process.

Figure 4:
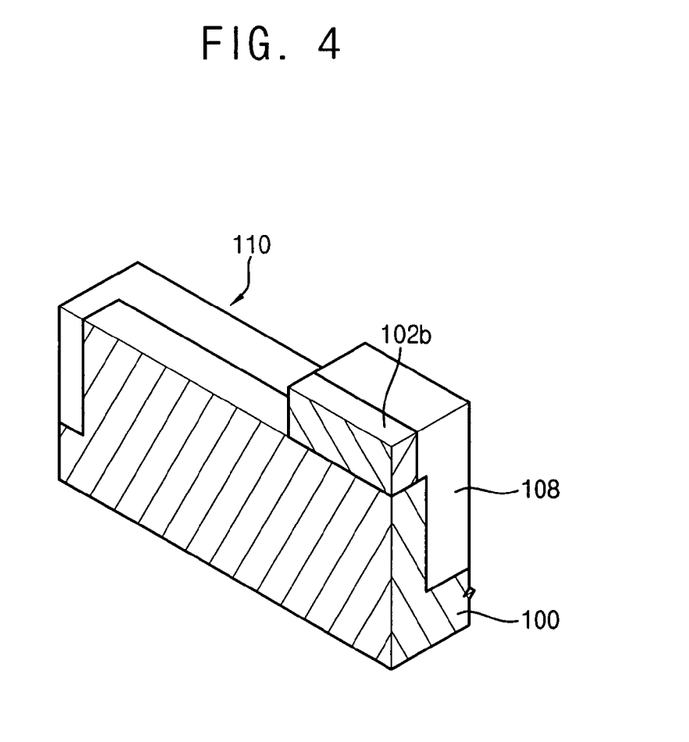

Referring to FIG. 4, the second hard mask pattern 102a is partially etched to from a third hard mask pattern 102b that selectively covers a first portion of the nanowire formation region 106 of the active area. When the second hard mask pattern 102a is partially etched, a second portion of the first preliminary insulation layer pattern 108 is removed. Thus, a first opening 110 is formed to expose a second portion of the nanowire formation region 106 in the active area.

Hereinafter, a process for forming the third hard mask pattern 102b will be described in detail.

After a second photoresist film is formed on the second hard mask pattern 102a and the first preliminary insulation layer pattern 108, the second photoresist film is exposed and developed to form a second photoresist pattern (not shown). The second photoresist pattern covers a first portion of the second hard mask pattern 102a formed on the first portion of the nanowire formation region 106 of the active area. The second photoresist pattern additionally covers a first portion of the first preliminary insulation layer 108 adjacent to the portion of the second hard mask pattern 102a. Thus, the second portion of the first preliminary insulation layer pattern 108 and the second portion of the nanowire formation region 106 are exposed through the first opening 110.

Using the second photoresist pattern as an etching mask, exposed second portions of the second hard mask pattern 102a and the first preliminary insulation layer pattern 108 are etched. Thus, the third hard mask pattern 102b is formed on the first portion of the nanowire formation region 106 in the active area. Additionally, the first opening 110 is formed to expose the second portions of the nanowire formation region 106 and the first preliminary insulation layer pattern 110.

Figure 5:
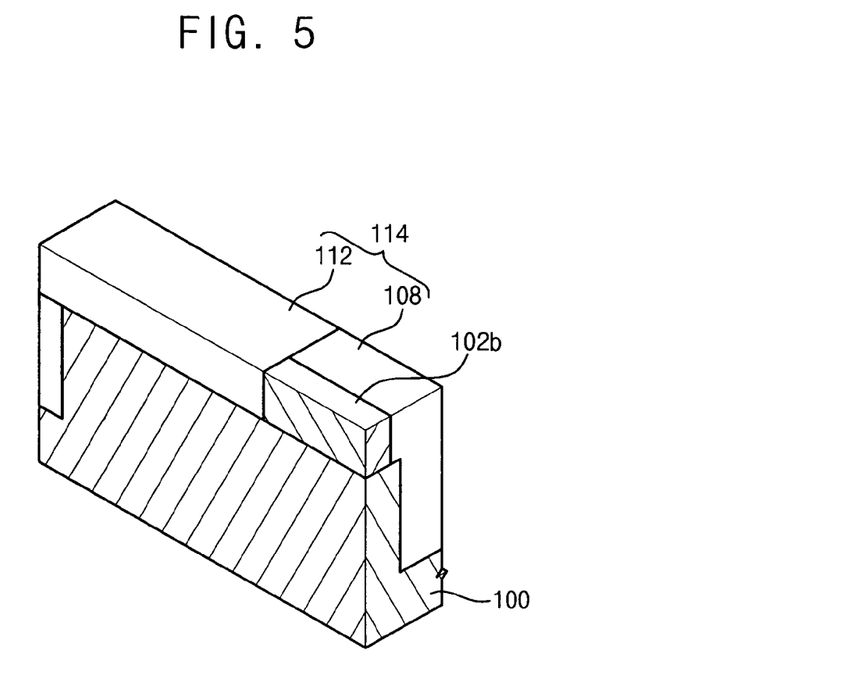

Referring to FIG. 5, a second preliminary insulation layer (not shown) is formed on the third hard mask pattern 102b to fill up the first opening. The second preliminary insulation layer may be formed of a material substantially the same as that of the first preliminary insulation layer pattern 108.

The second preliminary insulation layer is partially removed until the third hard mask pattern 102b is exposed to form a second preliminary insulation layer pattern 112 on the exposed second portions of the nanowire formation region 106 and the first preliminary insulation layer pattern 110. The second preliminary insulation layer pattern 112 may be formed by a CMP process. Hereinafter, the first and the second preliminary insulation layer patterns 108 and 112 are referred to as a first insulation layer pattern 114. In particular, the first insulation layer pattern 114 includes the second preliminary insulation layer pattern 112 and the first portion of the first preliminary insulation layer pattern 108.

Figure 6:
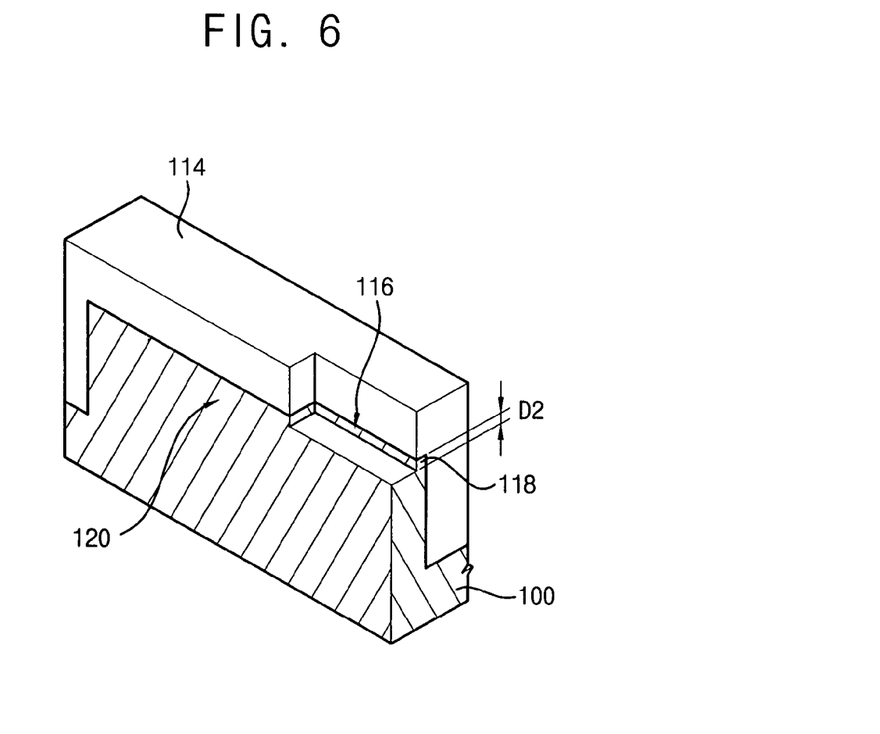

As shown in FIG. 6, the first insulation layer pattern 114 completely fills up the trench 104. In addition, the first insulation layer pattern 114 sufficiently covers the nanowire formation region 106 and a source/drain formation region 120.

The third hard mask pattern 102b is selectively removed to expose a first region of the active area adjacent to the first portion of the nanowire formation region 106. The third hard mask pattern 102b may be removed by a wet etching process or a dry etching process.

The exposed first region of the active area is partially etched using the first insulation layer pattern 114 as an etching mask, thereby forming a second opening 116 from a surface of the bulk semiconductor substrate 100. In the etching process for forming the second opening 116, a portion of the bulk semiconductor substrate 100 (i.e., the first region of the active area) is etched whereas the first insulation layer pattern 114 is not etched.

A second width D2 of the nanowire 124 is determined by a depth of the second opening 116. Thus, the second opening 116 may have the depth substantially the same as the second depth D2 capable of generating the volume invention. For example, the second depth D2 may be in a range of below about 5 nm.

After the formation of the second opening 116, two preliminary nanowires 118 and the source/drain formation region 120 are formed in the active area of the bulk semiconductor device 100.

Referring to FIG. 7, an insulation layer (not shown) is formed on a sidewall of the first insulation layer pattern 114 exposed through the second opening 116. The insulation layer is additionally formed on a sidewall of the second opening 116 and the exposed first region of the active area through the second opening 116. The insulation layer may be formed using a material that has an etching selectivity with respect to that of the bulk semiconductor substrate 100. For example, the insulation layer may be formed using an oxide such as silicon oxide.

The insulation layer is partially etched until the first region of the active area is exposed again such that a spacer 122 is formed on the sidewalls of the second opening 116 and the first insulation layer pattern 114.

Using the spacer 122 and the first insulation layer pattern 114 as implantation masks, first impurities are implanted into the exposed first region of the active area with a high impurity concentration. Hence, a first impurity region 130 having the high impurity concentration is formed in the active area. The first impurity region 130 is formed beneath an upper face of the active area so as to control an operation of the semiconductor device such as the transistor. The first impurity region 130 may be separated from a bottom face of the second opening 116 by a distance substantially equal to or larger than the width of the nanowire 124. The first impurities in the first impurity region 130 may have a conductive type opposite to a conductive type of the transistor.

Referring to FIG. 8, the first region of the active area exposed through the second opening 116 is partially etched until a first portion of the first insulation layer pattern 114 in the trench 104 is partially exposed. The first region of the active area may be partially etched by an isotropic etching process. In the isotropic etching process, the spacer 122 may not be etched.

In the etching process for partially etching the first region of the active area, the first region of the active area is initially etched along a vertical direction relative to the surface of the bulk semiconductor substrate 100. Then, the first region of the active area is horizontally etched to thereby expose the first portion of the first insulation layer pattern 114.

The first region of the active area may be partially etched by a wet etching process or a chemical dry etching (CDE) process. In the wet etching process, first region of the active area may be partially etched using an etching solution such as standard cleaning 1 (SC-1) solution that includes an ammonia ($NH_3$) solution, a hydrogen peroxide ($H_2O_2$) solution and deionized water (DIW).

In the etching process for partially etching the first region of the active area, the preliminary nanowire 118 is also partially etched so that the nanowire 124 is formed over the first impurity region 130. The nanowire 124 is separated from a surface of the active area, whereas the nanowire 124 is connected to both sides of the source/drain formation region 120. That is, the first impurity region 130 having the high impurity concentration is positioned under the nanowire 124.

As described above, the nanowire 124 may be formed by partially etching the bulk semiconductor substrate 100 without an SEG process. Therefore, the process for forming the nanowire 124 may be simplified and also manufacturing costs may be reduced.

Referring to FIG. 9, the first insulation layer pattern 114 is partially etched and the spacer 122 is completely etched until the nanowire 124 and the source/drain formation region 120 are exposed.

Particularly, the first insulation layer pattern 114 is partially etched to form a second insulation layer pattern 126. The second insulation layer pattern 126 has an upper face substantially lower than a bottom face of the nanowire 124. Simultaneously, the source/drain formation region 120 is exposed when the second insulation layer pattern 126 is formed. Then, the spacer 122 is completely etched to expose the nanowire 124.

In an example embodiment of the present invention, the spacer 122 may be etched, and then the first insulation layer pattern 114 may be partially etched.

In the etching process for exposing the nanowire 124 and for forming the second insulation layer pattern 126, the nanowire 124 and the bulk semiconductor substrate 100 may not be damaged when the first insulation layer pattern 114 and the spacer 122 are etched by a wet etching process.

FIG. 10 is a perspective view illustrating the nanowire for a channel in FIG. 9.

As shown in FIGS. 9 and 10, two nanowires 124 for a channel may have two bridge shapes that connect first sides of the source/drain formation region 120 to second sides of the source/drain formation region 120, respectively. Here, FIG. 9 is a perspective view along a line I-I' of FIG. 10.

Figure 11:
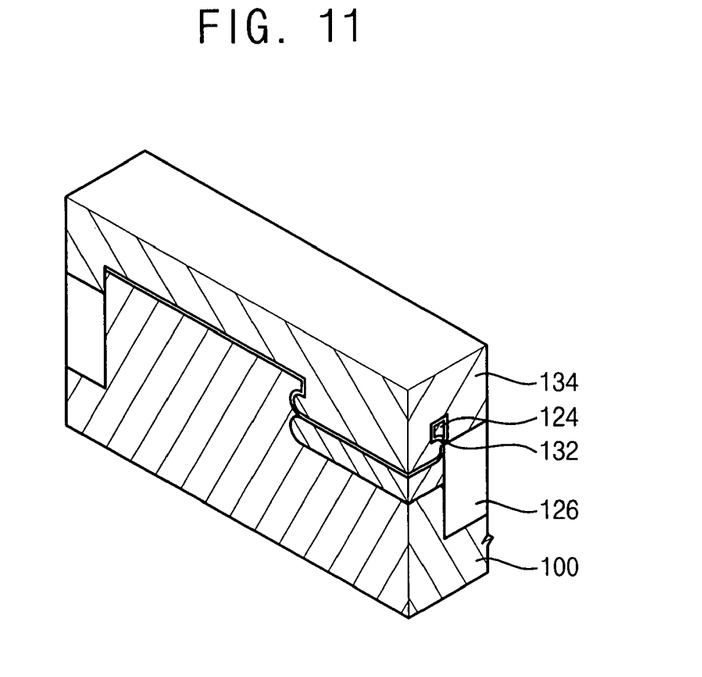

Referring to FIG. 11, a gate insulation layer 132 is formed on the bulk semiconductor substrate 100 to cover the nanowire 124. The gate insulation layer 132 may include silicon oxide formed through a thermal oxidation process.

A conductive layer 134 for a gate electrode is formed on the gate insulation layer 132 to completely enclose the nanowire 124. Particularly, the conductive layer 134 is formed beneath the nanowire 124, a gap between two nanowires 124, over the nanowires 124, and over the source/drain formation region 120.

The conductive layer 134 may be formed using polysilicon doped with impurities that sufficiently fills up the gap between two nanowires 124. Additionally, the conductive layer 134 may be formed by a low-pressure chemical vapor deposition (LPCVD) process.

In an example embodiment of the present invention, a metal layer or a metal silicide layer may be formed on the conductive layer 134.

Figure 12:
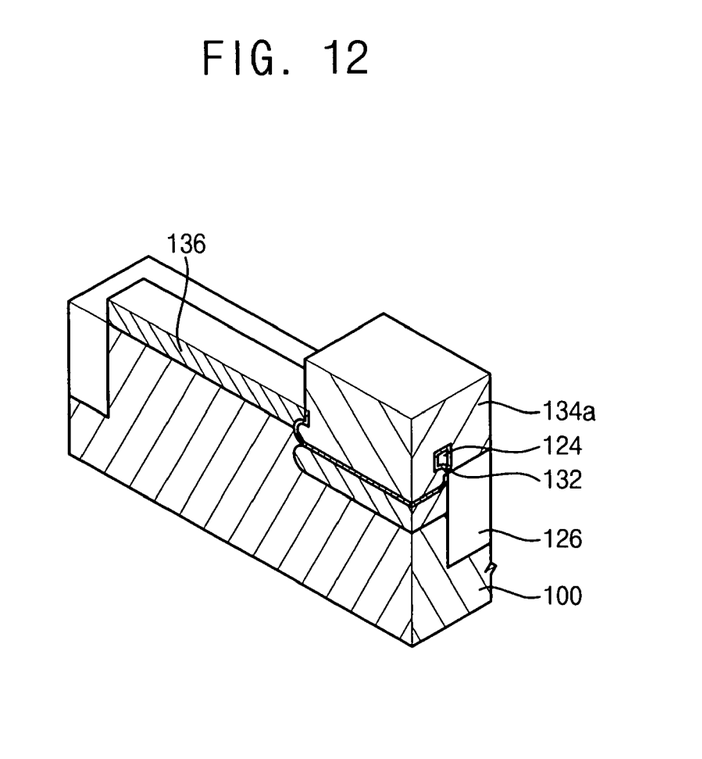
Figure 13:
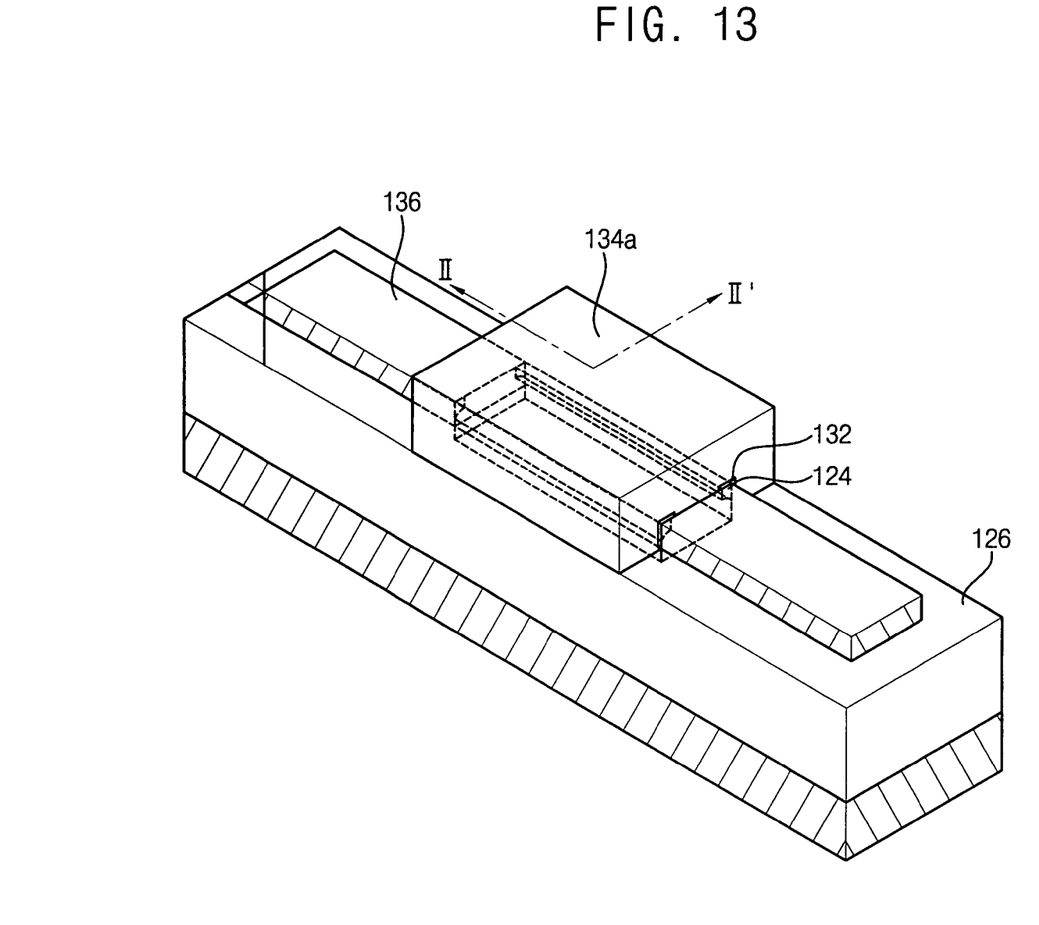
FIG. 13 is a perspective view illustrating a semiconductor device including a nanowire in accordance with an example embodiment of the present invention.

Referring to FIGS. 12 and 13, after a third photoresist film is formed on the conductive layer 134, the third photoresist film is exposed and developed to form a third photoresist pattern (not shown) on the conductive layer 134. The third photoresist pattern selectively covers the nanowires 124.

The conductive layer 134 is partially etched using the third photoresist pattern as an etching mask, thereby forming a conductive layer pattern 134a that serves as the gate electrode of the transistor.

Second impurities are doped into portions of the source/drain formation region 120 adjacent to the conductive layer pattern 134a so that source/drain regions 136 of the transistor are formed in the active area.

Therefore, two nanowires 124 and the conductive layer pattern 134a enclosing the nanowires 124 are formed in the active area of the bulk semiconductor substrate 100 as shown in FIG. 13. When the transistor is turned on by applying a predetermined voltage to the conductive layer pattern 134a, the channel of the transistor is formed in accordance with the volume inversions generated in the nanowires 124. As s result, electrons may rapidly move through the channel formed by the volume inversions of the nanowires 124 without scattering of the electrons. Additionally, the mobility of the electrons passing through the channel may be greatly improved.

Since the gate insulation layer 132 is formed on the bulk semiconductor substrate 100 beneath the nanowires 124, a parasite channel may be formed between the nanowires 124 and the bulk semiconductor substrate 100. In an example embodiment of the present invention, the first impurity region 130 having the high impurity concentration is formed beneath the nanowires 124 so as to effectively prevent the formation of the parasite channel. That is, since the first impurity region 130 has the conductive type opposed to that of the transistor, a parasite threshold voltage for forming the parasite channel may be greatly higher than a threshold voltage for forming the channel. Therefore, when the predetermined voltage is applied to the conductive layer pattern 134a so as to turn on the transistor, the channel is formed by the volume inversions of the nanowires 124 whereas the parasite channel may not formed between the nanowires 124 and the bulk semiconductor substrate 100. As a result, the portions of the bulk semiconductor substrate 100 under the nanowires 124 may not serve as another transistor.

According to the present invention, a bulk semiconductor substrate may be partially etched to form a semiconductor nanowire having a scale that may generate a volume inversion of a semiconductor material. Thus, the semiconductor nanowire may be formed with low cost through a simplified process. When a transistor includes the semiconductor nanowire, the transistor may have a high response speed because electrons may move through the semiconductor nanowire by greatly improved electron mobility.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a nanowire, comprising:
   forming a trench by partially etching a semiconductor substrate;
   forming an insulation layer pattern on the semiconductor substrate to fill up the trench, wherein the insulation layer pattern covers a first region of the semiconductor substrate where the nanowire is formed, and the insulation layer pattern covers a second region of the semiconductor substrate connected to the first region;
   forming an opening by etching an exposed portion of the semiconductor substrate by the insulation layer pattern using the insulation layer pattern as an etching mask;
   forming a spacer on sidewalls of the opening and the insulation layer pattern; and
   forming the nanowire connected to the second region by anisotropically etching a portion of the semiconductor substrate exposed by the opening until a portion of the insulation layer pattern formed in the trench is exposed.

2. The method of claim 1, wherein the first region has a width capable of generating a volume inversion to form a channel.

3. The method of claim 2, wherein the first region has the width below about 5 nm.

4. The method of claim 1, wherein forming the trench further comprises:
   forming a first hard mask pattern on the semiconductor substrate; and
   partially etching the semiconductor substrate using the first hard mask pattern as an etching mask.

5. The method of claim 4, wherein forming the insulation layer pattern further comprises:
   forming a second hard mask pattern exposing a portion of the first region adjacent to the trench by partially etching the first hard mask pattern;
   forming a first preliminary insulation layer pattern on the exposed portion of the first region to fill up the trench;
   forming an opening exposing the second region and a third hard mask pattern covering the first region except for the exposed portion of the first region by partially etching the second hard mask pattern and the first preliminary insulation layer pattern;
   forming a second preliminary insulation layer pattern to fill up the opening; and
   removing the third hard mask pattern.

6. The method of claim 5, wherein the second hard mask pattern is formed by an anisotropic etching process.

7. The method of claim 5, wherein an etched amount of the first hard mask pattern is substantially the same as a width of a channel that generates a volume inversion.

8. The method of claim 5, wherein forming the second preliminary insulation layer pattern further comprises:
   forming a second preliminary insulation layer to completely fill up the opening; and
   partially removing the second preliminary insulation layer until the third hard mask pattern is exposed.

9. The method of claim 1, wherein the opening has a depth substantially the same as a width of a channel that generates a volume inversion.

10. The method of claim 1, wherein the spacer is formed using a material having an etching selectivity relative to the semiconductor substrate.

11. The method of claim 10, wherein the spacer is formed using silicon oxide.

12. The method of claim 1, wherein forming the nanowire is performed by a wet etching process or a chemical dry etching process.

13. The method of claim 1, further comprising partially etching the insulation layer pattern and completely etching the spacer to expose the nanowire.

14. A method of manufacturing a semiconductor device, comprising:
   forming a trench by partially etching a semiconductor substrate;
   forming a first insulation layer pattern on the semiconductor substrate to fill up the trench, wherein the first insulation layer pattern covers a source/drain formation region of the semiconductor substrate, and the first insulation layer pattern covers a nanowire formation region of the semiconductor substrate connected to the source/drain formation region;
   forming an opening by etching an exposed portion of the semiconductor substrate by the first insulation layer pattern using the first insulation layer pattern as an etching mask;
   forming a spacer on sidewalls of the opening and the first insulation layer pattern;
   forming the nanowire connected to the source/drain formation region by anisotropically etching a portion of the semiconductor substrate exposed by the opening until a portion of the first insulation layer pattern formed in the trench is exposed;
   forming a second insulation layer pattern by partially etching the first insulation layer pattern and fully etching the spacer until the nanowire is exposed;
   forming a gate insulation layer on the semiconductor substrate to cover the nanowire; and
   forming a gate electrode on the gate insulation layer to enclose the nanowire.

15. The method of claim 14, wherein the nanowire formation region has a width that generates a volume inversion in a channel.

16. The method of claim 14, further comprising forming an impurity region having a high impurity concentration at a portion of the semiconductor substrate exposed through the opening the after forming the spacer.

17. The method of claim 16, wherein the impurity region is separated from a bottom face of the opening by a distance substantially the same as a width of the nanowire.

18. The method of claim 16, wherein the impurity region has a conductivity type opposite to a conductivity type of the semiconductor device.

19. The method of claim 14, wherein forming the trench further comprises:
   forming a first hard mask pattern on the semiconductor substrate; and
   partially etching the semiconductor substrate using the first hard mask pattern as an etching mask.

20. The method of claim 19, wherein forming the first insulation layer pattern further comprises:
   forming a second hard mask pattern exposing a portion of the nanowire formation region adjacent to the trench by partially etching the first hard mask pattern;
   forming a first preliminary insulation layer pattern on the exposed portion of the nanowire formation region to fill up the trench;
   forming an opening exposing the source/drain formation region and forming a third hard mask pattern covering the nanowire formation region except for the exposed portion of the nanowire formation region by partially etching the second hard mask pattern and the first preliminary insulation layer pattern;
   forming a second preliminary insulation layer pattern to fill up the opening; and
   removing the third hard mask pattern.

21. The method of claim 20, wherein an etched amount of the first hard mask pattern is substantially the same as a width of a channel that generates a volume inversion.

22. The method of claim 14, wherein the opening has a depth substantially the same as a width of a channel that generates a volume inversion.

23. The method of claim 14, further comprising forming source/drain regions by implanting impurities into the source/drain formation region.

24. The method of claim 14, wherein partially etching the first insulation layer pattern and fully etching the spacer are performed by a wet etching process.

* * * * *